United States Patent
Sircar et al.

(10) Patent No.: US 12,300,489 B2
(45) Date of Patent: May 13, 2025

(54) UV CURE FOR LOCAL STRESS MODULATION

(71) Applicant: Lam Research Corporation, Fremont, CA (US)

(72) Inventors: Anirvan Sircar, Beaverton, OR (US); Fayaz A. Shaikh, Lake Oswego, OR (US); Kevin M. McLaughlin, Sherwood, OR (US); Alexander Ray Fox, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 398 days.

(21) Appl. No.: 17/759,072

(22) PCT Filed: Jan. 25, 2021

(86) PCT No.: PCT/US2021/014905
§ 371 (c)(1),
(2) Date: Jul. 19, 2022

(87) PCT Pub. No.: WO2021/154641
PCT Pub. Date: Aug. 5, 2021

(65) Prior Publication Data
US 2023/0038611 A1 Feb. 9, 2023

Related U.S. Application Data

(60) Provisional application No. 62/968,006, filed on Jan. 30, 2020.

(51) Int. Cl.
H01L 21/02 (2006.01)
C23C 16/04 (2006.01)
(Continued)

(52) U.S. Cl.
CPC ...... H01L 21/02348 (2013.01); C23C 16/042 (2013.01); C23C 16/345 (2013.01);
(Continued)

(58) Field of Classification Search
None
See application file for complete search history.

(56) References Cited

U.S. PATENT DOCUMENTS

| 4,256,829 A | 3/1981 | Daniel |
| 5,009,738 A | 4/1991 | Gruenwald et al. |

(Continued)

FOREIGN PATENT DOCUMENTS

| CN | 101389415 A | 3/2009 |
| CN | 101484973 A | 7/2009 |

(Continued)

OTHER PUBLICATIONS

Sasaki et el, A Novel Low Wafer Stress I—Line Definable Polyimide, J. Polymer Science and Technology, vol. 15(2),2002, p. 167-172 (Year: 2022).*

(Continued)

*Primary Examiner* — Asok K Sarkar
(74) *Attorney, Agent, or Firm* — Weaver Austin Villeneuve & Sampson LLP

(57) ABSTRACT

Localized stresses can be modulated in a film deposited on a bowed semiconductor substrate by selectively and locally curing the film by ultraviolet (UV) radiation. A bowed semiconductor substrate can be asymmetrically bowed. A UV-curable film is deposited on the front side or the backside of the bowed semiconductor substrate. A mask is provided between the UV-curable film and a UV source, where openings in the mask are patterned to selectively define exposed regions and non-exposed regions of the UV-curable film. Exposed regions of the UV-curable film (Continued)

modulate localized stresses to mitigate bowing in the bowed semiconductor substrate.

20 Claims, 9 Drawing Sheets

(51) Int. Cl.
  C23C 16/34    (2006.01)
  C23C 16/505   (2006.01)
  H01L 21/66    (2006.01)
(52) U.S. Cl.
  CPC ........ *C23C 16/505* (2013.01); *H01L 21/0217* (2013.01); *H01L 22/20* (2013.01)

(56) References Cited

U.S. PATENT DOCUMENTS

| | | | |
|---|---|---|---|
| 5,338,363 A | 8/1994 | Kawata et al. | |
| 5,384,008 A | 1/1995 | Sinha et al. | |
| 6,046,097 A | 4/2000 | Hsieh et al. | |
| 6,051,501 A | 4/2000 | Becker et al. | |
| 6,153,012 A | 11/2000 | Rupp et al. | |
| 6,279,506 B1 | 8/2001 | Jurgensen et al. | |
| 6,306,245 B1 | 10/2001 | Yanagisawa et al. | |
| 6,838,355 B1 | 1/2005 | Stamper et al. | |
| 7,858,898 B2 | 12/2010 | Bailey, III et al. | |
| 7,943,007 B2 | 5/2011 | Bailey, III et al. | |
| 8,133,322 B2 | 3/2012 | Nakamura et al. | |
| 8,562,750 B2 | 10/2013 | Chen et al. | |
| 8,785,305 B2 | 7/2014 | Ramdani | |
| 8,912,075 B1 * | 12/2014 | Lei .......................... H01L 21/78 438/464 | |
| 9,433,973 B1 | 9/2016 | Ni et al. | |
| 9,613,842 B2 | 4/2017 | Garant et al. | |
| 9,847,221 B1 | 12/2017 | McLaughlin et al. | |
| 9,881,788 B2 | 1/2018 | Kim et al. | |
| 10,896,821 B2 | 1/2021 | Liu | |
| 10,903,070 B2 | 1/2021 | Liu et al. | |
| 2001/0004479 A1 | 6/2001 | Cheung et al. | |
| 2002/0179247 A1 | 12/2002 | Davis et al. | |
| 2004/0023475 A1 | 2/2004 | Bonser et al. | |
| 2004/0023502 A1 | 2/2004 | Tzou et al. | |
| 2004/0134611 A1 | 7/2004 | Kato et al. | |
| 2004/0137745 A1 | 7/2004 | Houghton et al. | |
| 2005/0022740 A1 | 2/2005 | Hatano | |
| 2005/0127361 A1 | 6/2005 | Hatano et al. | |
| 2006/0223333 A1 | 10/2006 | Li et al. | |
| 2007/0015374 A1 | 1/2007 | Granneman | |
| 2007/0068900 A1 | 3/2007 | Kim et al. | |
| 2007/0224826 A1 | 9/2007 | Delgadino et al. | |
| 2008/0150145 A1 | 6/2008 | King et al. | |
| 2009/0009675 A1 | 1/2009 | Cho et al. | |
| 2009/0241833 A1 | 10/2009 | Moshtagh et al. | |
| 2009/0291209 A1 | 11/2009 | Granneman et al. | |
| 2010/0261353 A1 | 10/2010 | Prins et al. | |
| 2011/0100955 A1 | 5/2011 | Pushparaj et al. | |
| 2011/0308551 A1 | 12/2011 | Chung et al. | |
| 2012/0090545 A1 | 4/2012 | Chiang et al. | |
| 2012/0097641 A1 | 4/2012 | Beckmann et al. | |
| 2012/0100639 A1 | 4/2012 | Urano | |
| 2013/0183834 A1 | 7/2013 | Rogers et al. | |
| 2014/0021673 A1 | 1/2014 | Chen et al. | |
| 2014/0080324 A1 | 3/2014 | Shrinivasan et al. | |
| 2014/0264345 A1 | 9/2014 | Tsai et al. | |
| 2015/0294917 A1 | 10/2015 | Devilliers | |
| 2015/0332912 A1 | 11/2015 | Nowak et al. | |
| 2015/0340225 A1 | 11/2015 | Kim et al. | |
| 2016/0020074 A1 | 1/2016 | Mohn et al. | |
| 2016/0203995 A1 | 7/2016 | Kanarik et al. | |
| 2016/0233100 A1 * | 8/2016 | Godet ............... H01L 29/66803 | |
| 2017/0053808 A1 | 2/2017 | Kamp et al. | |
| 2017/0069462 A1 | 3/2017 | Kanarik et al. | |
| 2017/0162522 A1 | 6/2017 | Chang et al. | |
| 2017/0167024 A1 | 6/2017 | Wiltse et al. | |
| 2017/0178891 A1 | 6/2017 | Batinica et al. | |
| 2018/0067403 A1 | 3/2018 | Devilliers | |
| 2018/0068860 A1 | 3/2018 | Devilliers et al. | |
| 2018/0082960 A1 | 3/2018 | Bellotti et al. | |
| 2019/0035646 A1 | 1/2019 | Nasman et al. | |
| 2019/0043876 A1 | 2/2019 | Van Schravendijk et al. | |
| 2019/0062947 A1 | 2/2019 | Savas et al. | |
| 2019/0287854 A1 | 9/2019 | Miller et al. | |
| 2020/0058486 A1 | 2/2020 | Dai et al. | |
| 2021/0079522 A1 | 3/2021 | Wu et al. | |
| 2021/0214846 A1 | 7/2021 | Nandwana et al. | |
| 2021/0265134 A1 | 8/2021 | Singh et al. | |
| 2021/0320036 A1 | 10/2021 | Jain et al. | |
| 2021/0366792 A1 | 11/2021 | Fulford et al. | |
| 2021/0404064 A1 | 12/2021 | Dip | |
| 2022/0013399 A1 | 1/2022 | Rondon et al. | |
| 2022/0403214 A1 * | 12/2022 | Teshiba ................... C09J 7/385 | |
| 2023/0032481 A1 | 2/2023 | Huang et al. | |
| 2023/0136819 A1 | 5/2023 | Porter et al. | |
| 2024/0003010 A1 | 1/2024 | Huang et al. | |
| 2025/0037992 A1 | 1/2025 | Hamma et al. | |

FOREIGN PATENT DOCUMENTS

| | | |
|---|---|---|
| CN | 102738307 A | 10/2012 |
| CN | 107611012 A | 1/2018 |
| EP | 1050601 A1 | 11/2000 |
| JP | H02220431 A | 9/1990 |
| JP | H11345807 A | 12/1999 |
| JP | 2001255670 A | 9/2001 |
| JP | 2002023390 A | 1/2002 |
| JP | 2003007073 A | 2/2003 |
| JP | 2004363444 A | 12/2004 |
| JP | 2007208079 A | 8/2007 |
| JP | 2010062363 A | 3/2010 |
| JP | 2010219106 A | 9/2010 |
| JP | 2013131646 A | 7/2013 |
| JP | 2016131238 A | 7/2016 |
| JP | 2017503359 A | 1/2017 |
| JP | 2017199909 A | 11/2017 |
| JP | 2018041080 A | 3/2018 |
| JP | 2019504490 A | 2/2019 |
| JP | 2020529736 A | 10/2020 |
| KR | 19990081521 A | 11/1999 |
| KR | 20080100366 A | 11/2008 |
| KR | 20100004640 A | 1/2010 |
| KR | 100980397 B1 | 9/2010 |
| KR | 20110068374 A | 6/2011 |
| KR | 20140029334 A | 3/2014 |
| KR | 20140086348 A | 7/2014 |
| KR | 20150133644 A | 11/2015 |
| KR | 20150139774 A | 12/2015 |
| KR | 20160085367 A | 7/2016 |
| KR | 20170074755 A | 6/2017 |
| KR | 20180027382 A | 3/2018 |
| KR | 20180095609 A | 8/2018 |
| KR | 20200060579 A | 6/2020 |
| KR | 20200133493 A | 11/2020 |
| KR | 102185623 B1 | 12/2020 |
| KR | 20210073235 A | 6/2021 |
| WO | WO-2019046134 A1 | 3/2019 |
| WO | WO-2019055366 A1 | 3/2019 |
| WO | WO-2020068139 A1 | 4/2020 |
| WO | WO-2021154641 A1 | 8/2021 |
| WO | WO-2021252019 A1 | 12/2021 |
| WO | WO-2022060615 A1 | 3/2022 |

OTHER PUBLICATIONS

CN Office Action dated Apr. 25, 2017 in CN Application No. 201510266980.4.
International Preliminary Report on Patentability and written opinion dated Jul. 14, 2022 in Application PCT/US2020/064344.
International Search Report and Written Opinion dated Apr. 9, 2021 in Application No. PCT/US2020/064344.
International Preliminary Report on Patentability dated Aug. 11, 2022 in PCT Application No. PCT/US2021/014905.

(56) References Cited

OTHER PUBLICATIONS

International Preliminary Report on Patentability dated Jun. 15, 2023 in Application No. PCT/US2021/060159.
International Preliminary Report on Patentability dated Sep. 15, 2022, in PCT Application No. PCT/US2021/020284.
International Search Report and Written Opinion dated Apr. 12, 2023 in PCT Application No. PCT/US2022/080562.
International Search Report and Written Opinion dated Apr. 26, 2022, in PCT Application No. PCT/US2021/060159.
International Search Report and Written Opinion dated Aug. 30, 2023, in Application No. PCT/US2023/021934.
International Search Report and Written Opinion dated Jan. 2, 2024 in PCT Application No. PCT/US2023/032425.
International Search Report and Written Opinion dated May 30, 2023, in Application No. PCT/US2023/012800.
International Search Report and Written Opinion dated Sep. 20, 2023 in PCT Application No. PCT/US2023/021927.
Invitation to Pay Additional Fees dated Mar. 7, 2022, in Application No. PCT/US2021/060159.
JP Office Action dated Jun. 20, 2023, in application No. JP2022-0169566 with English Translation.
KR First Office Action dated Dec. 29, 2022 in Application No. KR10-2022-7022697 with English translation.
KR Office Action dated Apr. 3, 2023, in Application No. KR10-2022-7018767 with English translation.
KR Office Action dated Apr. 28, 2023 in Application No. KR10-2022-7020427 with English Translation.
KR Office Action dated Dec. 14, 2023 in KR Application No. 10-2023-7026031, with English Translation.
KR Office Action dated Dec. 18, 2023 in KR Application No. 10-2023-7026375, with English Translation.
KR Office Action dated Feb. 8, 2023, in Application No. KR10-2022-7038549 with English translation.
KR Office Action dated Jan. 5, 2024 in KR Application No. 10-2023-7039480 with English translation.
KR Office Action dated Jan. 11, 2024 in KR Application No. 10-2023-7035349, with English Translation.
KR Office Action dated Jul. 15, 2022, in Application No. KR10-2022-7018767 with English translation.
KR Office Action dated Jul. 28, 2022, in Application No. KR10-2022-7020427 with English translation.
KR Office Action dated May 25, 2023, in application No. KR 10-2022-7022697 with English translation.
KR Office Action dated Nov. 25, 2022, in Application No. KR10-2022-7018767 with English translation.
KR Office Action dated Nov. 26, 2022, in Application No. KR10-2022-7020427 with English translation.
KR Prior Art Search dated Jun. 10, 2022, in application No. KR10-2022-7018767 with English translation.
KR Prior Art Search Report dated Nov. 27, 2023, in Application No. 10-2023-7039480 with English translation.
KR Prior Art Search Report dated Oct. 13, 2023, in application No. KR 10-2023-7026375 with English translation.
KR Search report dated Jul. 8, 2022, in Application No. 10-2022-7022697 with English translation.
U.S. Final Office Action dated Jun. 27, 2017 in U.S. Appl. No. 14/285,544.
U.S. Final Office Action dated Sep. 21, 2016 in U.S. Appl. No. 14/285,544.
U.S. Non-Final Office Action dated Apr. 22, 2016 in U.S. Appl. No. 14/285,544.
U.S. Non-Final Office Action dated Dec. 23, 2016 in U.S. Appl. No. 14/285,544.
U.S. Non-Final Office Action dated Oct. 27, 2015 in U.S. Appl. No. 14/285,544.
U.S. Notice of Allowance dated Sep. 21, 2017 in U.S. Appl. No. 14/285,544.
U.S. Appl. No. 18/255,287, inventors Huang et al., filed May 31, 2023.
U.S. Restriction requirement dated May 11, 2015 in U.S. Appl. No. 14/285,544.
International Preliminary Report on Patentability and Written Opinion dated Jun. 13, 2024 in PCT Application No. PCT/US2022/080562.
International Preliminary Report on Patentability and Written Opinion dated Sep. 12, 2024 in PCT Application No. PCT/US2023/012800.
International Search Report and Written Opinion dated Jun. 10, 2024 in PCT Application No. PCT/US2024/013598.
JP Office Action dated Nov. 26, 2024 in JP Application No. 2022-552718, with English Translation.
JP Office Action dated Oct. 1, 2024 in JP Application No. 2022-545024 with English translation.
KR Notice of Allowances dated Oct. 7, 2024 in KR Application No. 10-2023-7035349 with English Translation.
KR Office Action dated Aug. 26, 2024 in KR Application No. 10-2023-7026031, with English Translation.
KR Office Action dated Jul. 1, 2024 in KR Application No. 10-2023-7035349 with English translation.
KR Office Action dated Jul. 17, 2024 in KR Application No. 10-2023-7039480, with English Translation.
KR Office Action dated Jun. 27, 2024 in KR Application No. 10-2023-7026375, with English Translation.
TW Office Action dated May 31, 2024 in TW Application No. 110103017, with English translation.
U.S. Corrected Notice of Allowance dated Dec. 16, 2024 in U.S. Appl. No. 17/758,071.
U.S. Notice of Allowance dated Dec. 6, 2024 in U.S. Appl. No. 17/758,071.
U.S. Appl. No. 18/713,068, inventor Hamma S, filed May 23, 2024.
U.S. Appl. No. 18/840,480, inventors Lei T, et al., filed Aug. 21, 2024.
International Search Report and Written Opinion dated Dec. 3, 2024 in PCT Application No. PCT/US2024/042531.
SG Search Report and Written Opinion dated Jan. 1, 2025 in SG Application No. 11202251457R.
KR Office Action dated Mar. 19, 2025 in KR Application No. 10-2023-7026031, with English Translation.
U.S. Corrected Notice of Allowance dated Mar. 12, 2025 in U.S. Appl. No. 17/758,071.
U.S. Appl. No. 19/111,257, inventors Hamma S et al., filed Mar. 12, 2025.
KR Office Action dated Mar. 17, 2025 in KR Application No. 10-2022-7029890, with English Translation.

* cited by examiner

UV CURE FOR LOCAL STRESS MODULATION

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor manufacturing processes involve many deposition and etching operations, which can change wafer bow drastically. For example, in 3D-NAND fabrication, which is gradually replacing 2D-NAND chips due to lower cost and higher reliability in various applications, multi-stacked films with thick, high stress carbon-based hard masks and/or metallization lines can cause significant wafer warpage, leading to front side lithographic overlay mismatch, or even wafer bow beyond chucking limit of an electrostatic chuck.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a method of modulating local stress on a substrate. The method includes providing a bowed semiconductor substrate, depositing a UV-curable film on the bowed semiconductor substrate, and selectively curing one or more first regions of the UV-curable film by exposing the one or more first regions to UV radiation and using a first pre-patterned mask so as to locally modulate stress on the UV-curable film, where the UV-curable film mitigates bowing of the bowed semiconductor substrate. In some implementations, the method further includes providing the first pre-patterned mask between a UV source and the semiconductor substrate, where the first pre-patterned mask includes one or more openings corresponding to the one or more first regions of the UV-curable film. In some implementations, the method further includes measuring warpage across the bowed semiconductor substrate to determine localized stresses on the bowed semiconductor substrate, and patterning the one or more openings in a mask to form the first pre-patterned mask, the one or more openings being patterned based on at least the localized stresses on the bowed semiconductor substrate. In some implementations, the one or more first regions of the UV-curable film is exposed to the UV radiation according to a controlled time, temperature, intensity, and/or wavelength of UV radiation for locally modulating the stress in the one or more first regions of the UV-curable film. In some implementations, a temperature of exposure to UV radiation is between about 200° C. and about 500° C. In some implementations, an intensity of the UV radiation is between about 1 $\mu W/cm^2$ and about 10 $W/cm^2$. In some implementations, the UV radiation is configured to locally modulate stress on the UV-curable film by an amount between about 200 MPa and about 4000 MPa. In some implementations, the bowed semiconductor substrate is asymmetrically bowed having a warpage greater than about ±300 µm. In some implementations, depositing the UV-curable film on the bowed semiconductor substrate occurs on a backside of the bowed semiconductor substrate.

Also provided herein is a method of preparing a mask for localized stress modulation. The method includes patterning one or more openings in a mask to form a pre-patterned mask, the one or more openings being patterned based on at least a stress map of a semiconductor substrate and/or pre-determined die pitch of the semiconductor substrate, and providing the pre-patterned mask to a UV chamber, where the pre-patterned mask is configured to cause one or more exposed regions of a UV-curable film deposited on the semiconductor substrate to become more tensile compared to one or more non-exposed regions of the UV-curable film when the semiconductor substrate is exposed to UV radiation. In some implementations, the method further includes receiving a stress map of a semiconductor substrate indicating levels of asymmetric bowing in one or more areas of the semiconductor substrate.

Also provided herein is an apparatus for modulating stress on a substrate. The apparatus includes a processing chamber that includes a substrate support for supporting a bowed semiconductor substrate, a UV source for exposing the bowed semiconductor substrate to UV radiation, and a controller. The controller is configured with instructions for performing the following operations: provide the bowed semiconductor substrate in the processing chamber having a UV-curable film deposited on a front side or backside of the bowed semiconductor substrate, and selectively cure one or more first regions of the UV-curable film by using a first pre-patterned mask that selectively exposes the one or more first regions to UV radiation so as to locally modulate stress on the UV-curable film, where the UV-curable film mitigates bowing of the bowed semiconductor substrate. In some implementations, the controller is configured with instructions for varying time, temperature, intensity, and/or wavelength of UV radiation when selectively curing the one or more first regions of the UV-curable film. In some implementations, the apparatus further includes a deposition chamber separate from the processing chamber, where the controller is further configured with instructions for performing the following operation: deposit the UV-curable film on the front side or backside of the bowed semiconductor substrate.

DETAILED DESCRIPTION

Figure 1A:
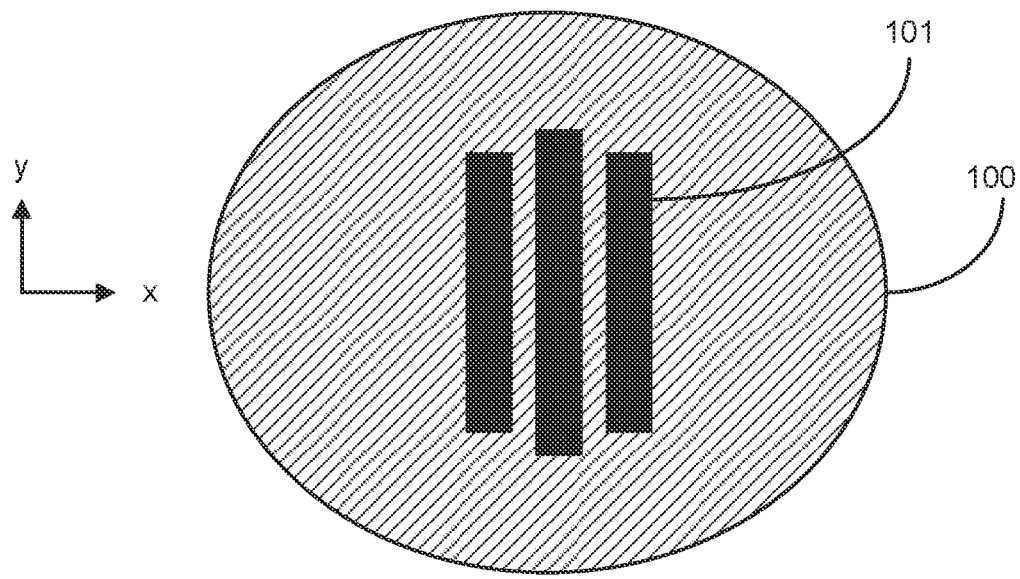
FIG. 1A shows a top view in an x-y plane of a schematic of an example bowed semiconductor substrate.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials.

Semiconductor fabrication processes involve formation of various structures, many of which may be two-dimensional. As semiconductor device dimensions shrink and devices are scaled to be smaller, the density of features across a semiconductor substrate increases, resulting in layers of material etched and deposited in various ways, including in three dimensions. For example, 3D-NAND is one technology that is becoming increasingly popular due to lower cost and increased memory density compared to other techniques, such as 2D-NAND, and higher reliability in various applications. During the fabrication of a 3D-NAND structure, wafer bow can change drastically. For example, deposition of thick hard mask materials and etching of trenches along a wafer surface in fabricating a 3D-NAND structure can cause wafer bowing. As layers of films are stacked on top of each other during fabrication, more stress is introduced to the semiconductor wafer which can cause bowing. Bowing can be measured using an optical technique. Wafer bowing can be measured or evaluated by obtaining a wafer map or stress map. Bowing can be quantified using a bow value or warpage value as described herein, which is measured as the vertical distance between the lowest point of the semiconductor wafer to the highest point on the wafer. The warpage value can be along one or more axes—for example, an asymmetrically warped wafer may have an x-axis warpage and/or a y-axis warpage.

In a bow-shaped wafer, the lowest point is the center of the wafer and the highest point is the edge of the wafer. In a dome-shaped wafer, the lowest point is the edge of the wafer and the highest point is the center of the wafer. Bow-shaped and dome-shaped wafers have symmetrical or largely symmetrical bowing. Wafers can also have asymmetric bowing. In asymmetric bowing, warpage is measured along an x-axis and a y-axis. An asymmetrically bowed wafer has different values for the x-axis warpage and y-axis warpage. In some cases, an asymmetrically bowed wafer has a negative x-axis warpage and a positive y-axis warpage. In some cases, an asymmetrically bowed wafer has a positive x-axis warpage and a negative y-axis warpage. In some cases, an asymmetrically bowed wafer has both a positive x-axis warpage and a positive y-axis warpage, but the warpage values are different. In some cases, an asymmetrically bowed wafer has both a negative x-axis warpage and a negative y-axis warpage, but the warpage values are different. One example of an asymmetrically bowed wafer is a saddle-shaped wafer. For a saddle-shaped wafer, in one example, the warpage on the x-axis may be +200 µm and the warpage on the y-axis may be −200 µm. Saddle-shaped wafers have two opposing edges of the wafer that are curved upward while another two opposing edges of the wafer are curved downward. As used herein, warpage can refer to any deviation from planarity exhibited by a wafer, where a bow-shaped wafer, dome-shaped wafer, and saddle-shaped wafer are examples of different types of warpage in a wafer.

Bowing can cause problems with subsequent processing, such as during lithography, as etching can be uneven if the semiconductor substrate is warped. High bowing can be caused by deposition of thick, high stress carbon hard mask layer. Additionally, due to multi-stacked films and the presence of thick, high stress carbon-based hard masks used in such fabrication processes, etching can cause some asymmetric warpage and deposition processes can introduce significant wafer warpage of up to a variation between +500 µm to −1300 µm bow. For example, an ashable hard mask may have a stress value of up to −1000 MPa and have a bow value of up to −1000 µm. Addressing such wafer warpage can be a challenge as subsequent processing may be affected by a wafer warpage exceeding +500 µm, and can be a particular challenge, especially when wafers are used in subsequent processing that involve chucking of the wafer to an electrostatic chuck, as many electrostatic chucks have a "chucking limit," which is defined as the maximum warpage tolerated before the wafer cannot be effectively chucked. Many electrostatic chucks have a chucking limit of about ±300 µm. As a result, highly warped semiconductor substrates may not be processed in some tools. Additionally, processing of highly warped semiconductor substrates may cause further warping. For example, etching of a trench in one direction can cause warping in asymmetric bowing due to asymmetric stress on the semiconductor substrate.

Some techniques exist for addressing bowing of semiconductor wafers. In some cases, techniques can be used to deposit a compensation layer on a backside of the semiconductor wafer. However, application of backside deposition with a compensation layer has been limited to monotonic global wafer warpage mitigation. Specifically, techniques for addressing bowing of semiconductor wafers have generally been limited to techniques that are axially symmetric or multi-axially symmetric.

As 3D-NAND technologies continue to scale up and high-aspect ratio features become increasingly more common, new challenges are emerging related to localized stress and inter-die stress variations on semiconductor substrates. Localized stress and inter-die stress variations may lead to block-bending, cell cross-talk, cell loss, and/or cell misalignments. Localized stress refers to stress changes that occur within a wafer in a non-uniform manner, e.g., not readily described by a linear function or higher-order polynomial function of stress vs. (x, y) position. This is in contrast with global stress, which can be described by such a linear or polynomial function. Inter-die stress is an example of localized stress. Poorly compensated/corrected localized stress may lead to localized wafer topology changes, which in turn may lead to poor alignment during lithography. Such poor alignment is typically viewed in terms of in-plane distortion (IPD), which is a quantification of the vector displacement of on-wafer alignment marks from their expected positions due to wafer topology. High IPD during lithography may lead to undesirable changes in critical dimensions or any other feature that is defined in a lithographic step, and so the foregoing phenomena of block-blending, cell cross-talk, cell loss, and/or cell misalignments can arise due to lithographic errors.

Figure 1B:
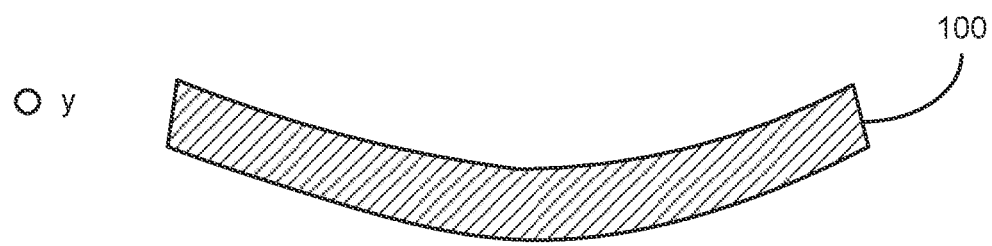
FIG. 1B shows a side view in a y-axis direction of the bowed semiconductor substrate of FIG. 1A.
Figure 1C:
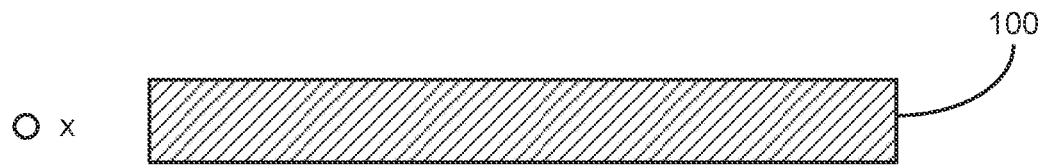
FIG. 1C shows a side view in an x-axis direction of the bowed semiconductor substrate of FIG. 1A.

In some cases, metallization structures and/or lines are being deposited along either the y-axis direction or the x-axis direction, but not necessarily both. FIG. 1A shows a top view in an x-y plane of a schematic of an example bowed semiconductor substrate. A semiconductor substrate 100 may include metal lines 101 deposited near a center of the semiconductor substrate 100. The metal lines 101 run along the y-direction of the semiconductor substrate 100. However, there are no metal lines that run along the x-direction of the semiconductor substrate 100. This creates bowing that is taco-shaped or cannoli-shaped as shown in FIG. 1B. FIG. 1B shows a side view in a y-axis direction of the bowed semiconductor substrate of FIG. 1A. As shown in FIG. 1B, the semiconductor substrate 100 is curved downward towards a center of the bowed semiconductor substrate from a perspective of the y-axis. FIG. 1C shows a side view in an x-axis direction of the bowed semiconductor substrate of FIG. 1A. As shown in FIG. 1C, the semiconductor substrate 100 is flat from a perspective of the x-axis. As discussed above, warpage refers to any deviation from planarity exhibited by a wafer, where a taco-shaped wafer or cannoli-shaped wafer represents an example of warpage in a wafer.

FIGS. 1A-1C illustrate an example of localized stress variations that may lead to asymmetric bowing. In addition, localized stress variations in a semiconductor substrate may cause one or more dies to become bowed when the semiconductor substrate is diced. Existing techniques for compensating bow on bowed semiconductor substrates generally do not mitigate bow in a single axial direction or in a localized fashion.

The present disclosure provides a method for mitigating bow in a bowed semiconductor substrate by depositing a UV-curable film on the bowed semiconductor substrate and selectively curing one or more regions of the UV-curable film to locally modulate stress on the UV-curable film. By selectively exposing certain regions of the UV-curable film to UV light of appropriate wavelengths and locally modulating stress on the UV-curable film, local stresses on the bowed semiconductor substrate can be tuned to achieve local warpage topography. The UV-curable film may be deposited on a front side or backside of the bowed semiconductor substrate. After the UV-curable film is deposited on the bowed semiconductor substrate, a pre-patterned mask is provided between a UV source and the UV-curable film. The pre-patterned mask blocks off UV exposure selectively so that one or more regions are exposed to UV radiation, causing localized stress changes in the UV-curable film to locally modulate stress. Time, temperature, intensity, and wavelengths of UV exposure may be controlled to tune local stress modulation.

Figure 2A:
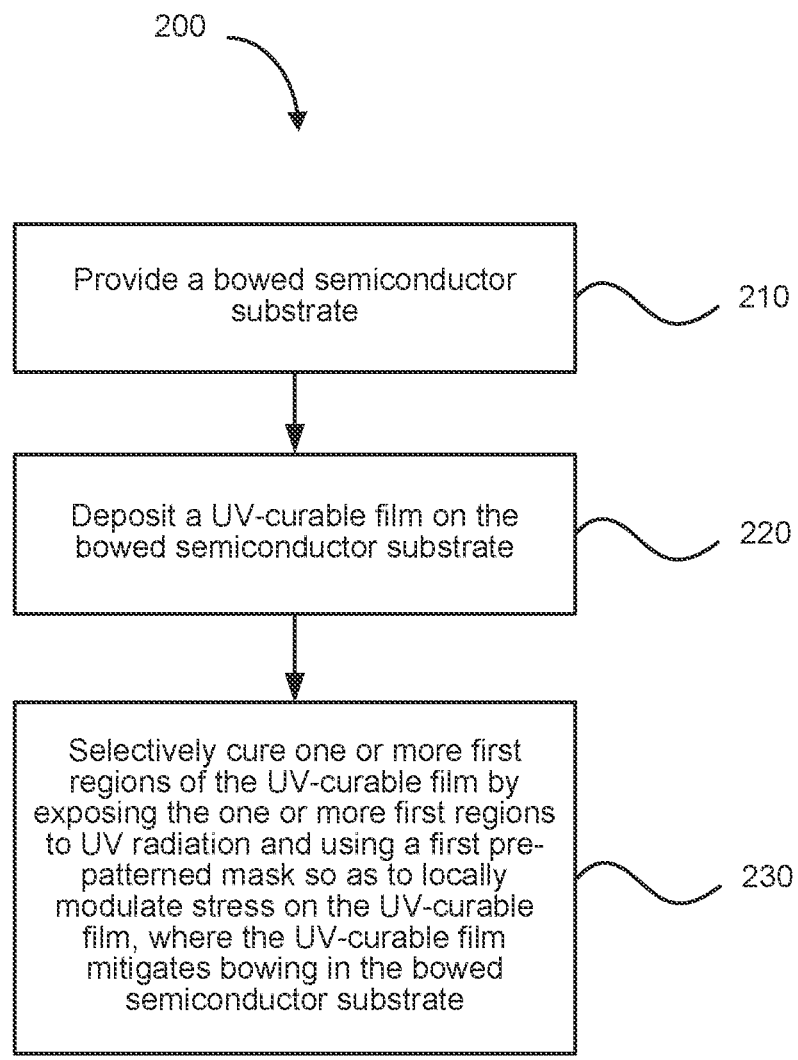
FIG. 2A illustrates a flow diagram of an example method of modulating local stresses on a bowed semiconductor substrate according to some implementations.

FIG. 2A illustrates a flow diagram of an example method of modulating local stresses on a bowed semiconductor substrate according to some implementations. The operations of a process 200 may be performed in different orders and/or with different, fewer, or additional operations. The operations of the process 200 may be performed using an apparatus for film deposition in FIG. 5, an apparatus for UV exposure in FIG. 6, or combinations thereof. In some implementations, the operations of the process 200 may be implemented, at least in part, according to software stored in one or more non-transitory computer readable media.

At block 210 of the process 200, a bowed semiconductor substrate is provided. The bowed semiconductor substrate may be provided in a process chamber for performing deposition and/or UV exposure operations. The substrate may be a silicon wafer, such as a 200-mm wafer, 300-mm wafer, or a 450-mm wafer, including wafers having one or more layers of material, such as dielectric, conducting, or semiconducting materials deposited thereon. Some of the one or more layers may be patterned. Non-limiting examples of layers include dielectric layers and conducting layers such as silicon oxides, silicon nitrides, silicon carbides, metal oxides, metal nitrides, metal carbides, and metal layers. In various implementations, the substrate is patterned.

In some implementations, the semiconductor substrate includes a patterned 3D-NAND structure and one or more etched trenches in the substrate. In some implementations, the patterned 3D-NAND structure includes one or more metal layers or lines that longitudinally extend in a single axial direction along the semiconductor substrate. The semiconductor substrate may be bowed. In some implementations, the bowed semiconductor substrate has compressive bowing. In some implementations, the bowed semiconductor substrate has tensile bowing. In some implementations, the bowed semiconductor substrate may be asymmetrically bowed.

The bowed semiconductor substrate may have a warpage of about ±1000 µm. In some implementations, the bowed semiconductor substrate has a warpage greater than about ±300 µm. In some implementations, the bowed semiconductor substrate has a warpage greater than about ±300 µm and less than about ±1000 µm. The warpage may occur at one or more localized regions of the bowed semiconductor substrate. The warpage may have different values between an x-axis warpage and y-axis warpage. Thus, the warpage may be more significant along one axis compared to another axis. In some implementations, the bowed semiconductor substrate is taco-shaped.

In some implementations, the bowed semiconductor substrate is provided in a process chamber for performing a deposition operation, where the process chamber for performing a deposition operation may be configured for backside or front side deposition. In some implementations, backside deposition may be achieved by having the bowed semiconductor substrate placed upside down so that a backside is facing towards a top showerhead of the process chamber. In some implementations, backside deposition may be achieved by delivering process gases to the backside of the bowed semiconductor substrate from a bottom showerhead (showerhead to pedestal) of the process chamber.

Figure 3A:
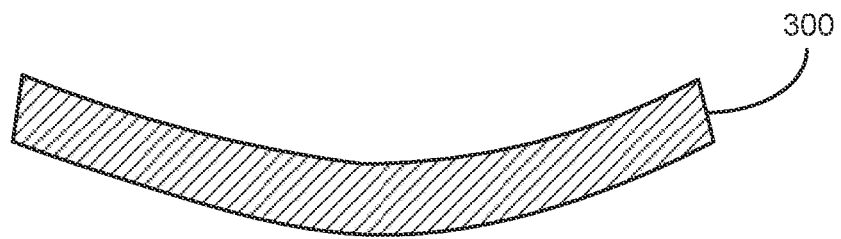
FIGS. 3A-3D show cross-sectional schematic illustrations of a bowed semiconductor substrate undergoing a process of localized stress modulation by selective ultraviolet (UV) curing to mitigate bowing according to some implementations.

FIG. 3A shows a cross-sectional schematic illustration of a bowed semiconductor substrate. The bowed semiconductor substrate 300 may have compressive bowing. In some implementations, the compressive bowing may occur along a single axial direction of the bowed semiconductor substrate 300. The bowed semiconductor substrate 300 may be asymmetrically bowed, where warpage may have different values between an x-axis warpage and y-axis warpage. One or more localized regions of the bowed semiconductor substrate 300 may have varying stress levels. A stress map of the bowed semiconductor substrate 300 may indicate levels of bowing in the one or more localized regions of the bowed semiconductor substrate 300. The levels of bowing correlate to levels of stress in the one or more localized regions of the bowed semiconductor substrate 300.

Returning to FIG. 2A, at block 220 of the process 200, a UV-curable film is deposited on the bowed semiconductor substrate. The UV-curable film is deposited on a front side or a backside of the bowed semiconductor substrate. In some implementations, the UV-curable film is deposited on a backside of the bowed semiconductor substrate. That way, the UV-curable film avoids being deposited on circuits, transistors, or other device components on the front side of the bowed semiconductor substrate. The UV-curable film may serve as a bow compensation layer for mitigating bowing in the bowed semiconductor substrate.

In some implementations, the UV-curable film is not only configured to be cured by exposure to ultraviolet radiation, but the UV-curable film is configured to undergo stress value changes by a significant amount. The UV-curable film is configured to undergo stress value changes by an amount greater than about 200 MPa, such as an amount between about 200 MPa and about 4000 MPa. In other words, a difference between a stress value of the as-deposited UV-curable film and a stress value of the post-cured UV-curable film is greater than about 200 MPa, such as between about 200 MPa and about 4000 MPa. For example, an as-deposited stress value of the UV-curable film may be less than about −100 MPa, and a post-cured stress value of the UV-curable film may be greater than about +100 MPa. In some implementations, the as-deposited UV-curable film may be more compressive and the post-cured UV-curable film may be more tensile.

In some implementations, the UV-curable film includes a dielectric material such as an ultralow-k dielectric material. In some implementations, the UV-curable film includes a nitride or doped nitride. Nitrides may be able to undergo significant stress changes after UV curing, whereas many oxides and carbides are not able to undergo significant stress changes. In some examples, the UV-curable film includes silicon nitride. In some examples, the UV-curable film includes silicon carbonitride. In some implementations, a thickness of the UV-curable film is between about 20 nm and about 150 nm, between about 25 nm and about 100 nm, or between about 30 nm and about 100 nm. The thickness of the UV-curable film is thin enough for full penetration of UV irradiation, and thick enough for inducement of stress on an underlying bowed semiconductor substrate.

Figure 5:
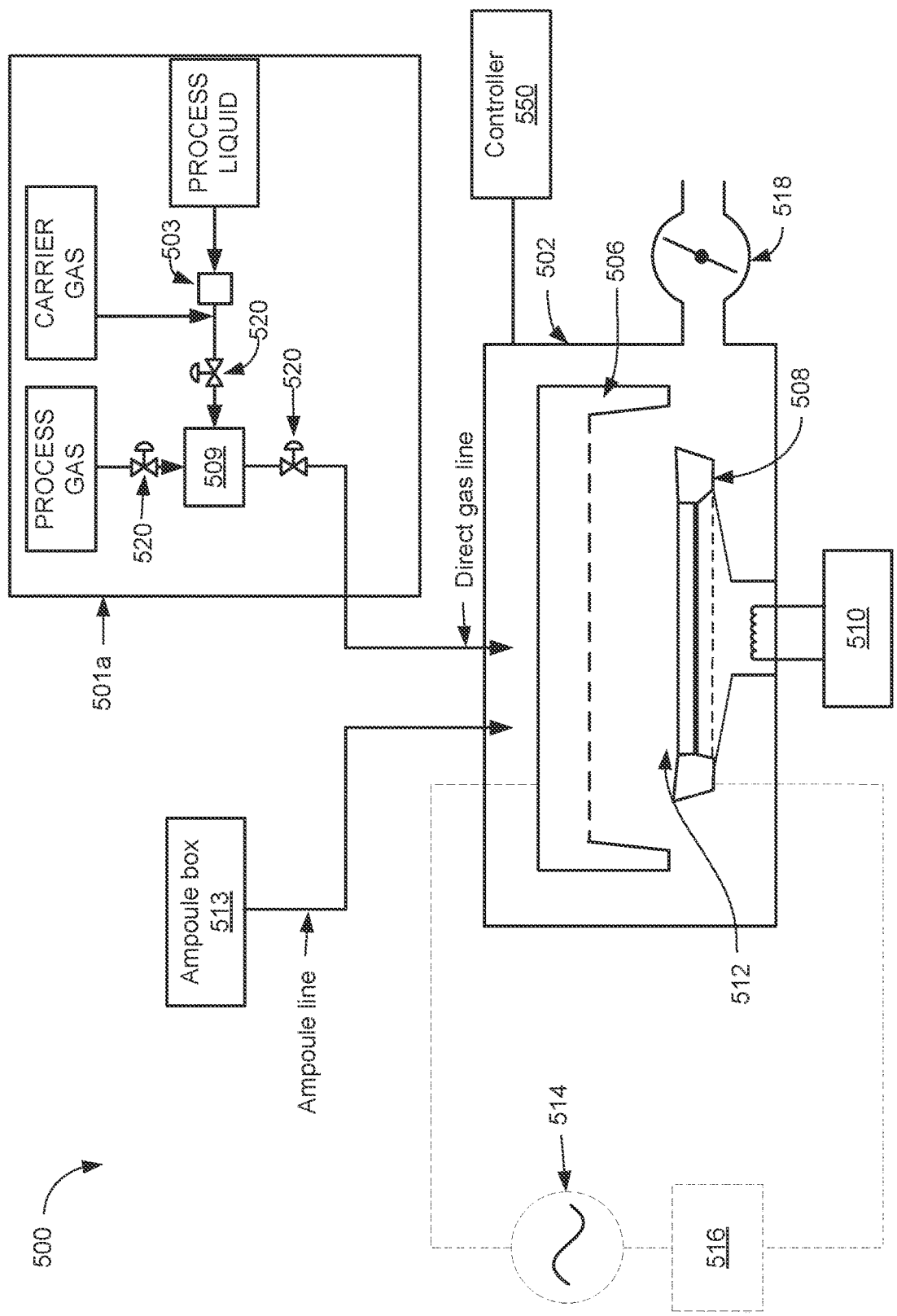
FIG. 5 illustrates a schematic diagram of an example apparatus for deposition of a UV-curable film according to some implementations.

The UV-curable film is deposited on the bowed semiconductor substrate by any suitable deposition technique. In some implementations, the UV-curable film is deposited by a chemical vapor deposition (CVD) process such as plasma-enhanced chemical vapor deposition (PECVD) process. The UV-curable film may be deposited in the process chamber for deposition, where a suitable process chamber for deposition is shown in FIG. 5. During PECVD, a silicon-containing precursor such as silane may react with one or more reactive gases exposed to plasma to form silicon nitride on the bowed semiconductor substrate. In some implementations, silane ($SiH_4$) may be flowed into the process chamber with ammonia ($NH_3$) and/or nitrogen ($N_2$). An inert gas such as helium (He) may be present. The PECVD silicon nitride may be deposited at temperatures between about 250° C. and about 550° C. The PECVD silicon nitride may be deposited at a pressure between about 2 Torr and about 20 Torr.

Films deposited by PECVD generally contain a considerable amount of hydrogen. For example, PECVD silicon nitride films contain hydrogen in the form of Si—H and N—H bonds. Without being limited by any theory, it is believed that stress changes develop from UV treatment of PECVD silicon nitride from reduction of hydrogen and shrinkage of voids.

Figure 3B:
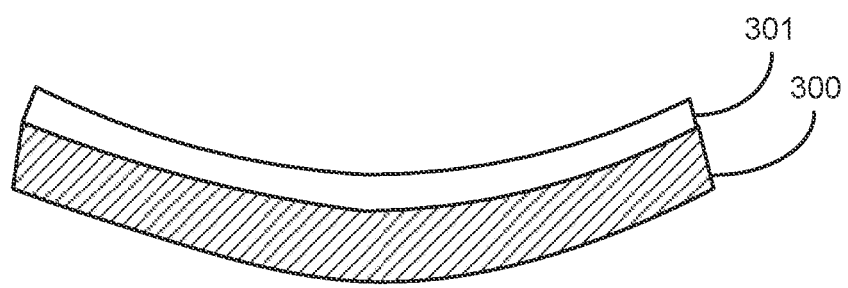

FIG. 3B shows a cross-sectional schematic illustration of a UV-curable film deposited on the bowed semiconductor substrate of FIG. 3A. The UV-curable film 301 may be deposited on a front side or backside of the bowed semiconductor substrate 300. In some implementations, the UV-curable film 301 is a nitride such as silicon nitride. The UV-curable film 301 may be a compressive nitride, where the as-deposited stress value of the UV-curable film 301 is negative. For example, the as-deposited stress value of the UV-curable film is less than about −100 MPa (more negative), less than about −200 MPa, or less than about −300 MPa. The UV-curable film 301 may be configured to undergo significant changes in stress value after UV treatment, where the stress change may be greater than about 200 MPa, between about 200 MPa and about 4000 MPa, or between about 200 MPa and about 2000 MPa. In some implementations, the UV-curable film 301 is deposited by PECVD.

Returning to FIG. 2, at block 230 of the process 200, one or more first regions of the UV-curable film are selectively cured by exposing the one or more first regions to UV radiation and using a first pre-patterned mask so as to locally modulate stress on the UV-curable film. The UV-curable film after being selectively cured mitigates bowing in the bowed semiconductor substrate. The first pre-patterned mask is provided between a UV source and the bowed semiconductor substrate, where the first pre-patterned mask includes one or more openings corresponding to the one or more first regions of the UV-curable film.

The first pre-patterned mask selectively blocks off UV exposure so that only certain areas of the bowed semiconductor substrate are exposed to UV radiation. That way, exposed regions of the UV-curable film are selectively cured and undergo stress changes, while non-exposed regions of the UV-curable film are blocked off from UV exposure and do not undergo stress changes. As used herein, the exposed regions of the UV-curable film are used interchangeably with one or more first/second regions of the UV-curable film. In some implementations, the exposed regions of the UV-curable film can become more tensile or more compressive in stress compared to the non-exposed regions. Thus, localized compressive or tensile stress increases in exposed regions compared to non-exposed regions. These changes in stress in the exposed regions of the UV-curable film may be induced to one or more areas of the bowed semiconductor substrate, thereby locally modulating stress to mitigate bowing in the bowed semiconductor substrate. In other words, if one or more areas of the bowed semiconductor substrate are bowed as a result of compressive stress, the exposed regions of the UV-curable film directly overlying the one or more areas of the bowed semiconductor substrate are increased in tensile stress to compensate. As a result, bowing in the one or more areas of the bowed semiconductor substrate is mitigated.

Without being limited by any theory, changes in stress may develop from reduction of hydrogen in the UV-curable film during UV curing. This may be observed in PECVD silicon nitride films. The loss of hydrogen and/or shrinkage of voids may result in a volume reduction in the UV-curable film. However, the constraint of the semiconductor substrate may prevent any lateral shrinkage, thus imposing tensile strain in the exposed regions of the UV-curable film. In some implementations, selectively curing the one or more first regions of the UV-curable film causes exposed regions to become more tensile in stress compared to non-exposed regions of the UV-curable film.

The first pre-patterned mask may be made of a material that blocks or substantially blocks UV radiation. In some implementations, the first pre-patterned mask includes a metal, ceramic, or silicon. The one or more openings in the first pre-patterned mask may be geometrically designed to target the one or more areas of the bowed semiconductor substrate with UV exposure, thereby mitigate bowing in the one or more areas of the bowed semiconductor substrate. The one or more openings may be circular, rectangular, or any suitable shape. In some implementations, the one or more openings may be patterned based on measurements of localized stresses on the bowed semiconductor substrate. Measurements of localized stresses on the bowed semiconductor substrate may be generated from a stress map.

Curing the one or more first regions of the UV-curable film occurs by UV exposure. As used herein, UV radiation may broadly include radiation from 150 nm to the infrared region (about 1-10 µm). In some implementations, the UV source may provide UV exposure within a range of about 200-800 nm. The UV source may emit UV radiation in a range or in a single wavelength. The UV source may emit UV radiation in a continuous mode or pulsing mode to control film stress change. Selective curing of the UV-curable film causes higher stress values to be induced in the one or more first regions.

The degree of local stress modulation in the one or more first regions depends on treatment conditions during UV curing. In some implementations, the degree of local stress modulation in the one or more first regions depends on time, temperature, intensity, and/or wavelength of UV radiation. However, it will be understood by those skilled in the art that other conditions during UV curing may be controlled to affect the degree of local stress modulation. Nonetheless, by tuning one or more of: (1) time of UV exposure, (2) substrate temperature during UV exposure, (3) intensity of UV exposure, and (4) wavelength of UV exposure, the amount of stress change induced in exposed regions compared to non-exposed regions will vary. For example, longer UV exposure times lead to higher stress values, higher substrate temperatures lead to higher stress values, and higher intensity lead to higher stress values. It will be understood that longer UV exposure times, higher substrate temperatures, and higher intensity may reach certain limits in controlling stress values. Time, temperature, intensity, and wavelength of UV exposure may be finely tuned to achieve certain levels of local stress modulation in the one or more first regions. The UV source may be configured to control time of UV exposure (i.e., dose), intensity of UV exposure, and wavelength of UV exposure. A substrate support (i.e., pedestal) may be configured to control substrate temperature.

In some implementations, the time of UV exposure is between about 0.5 minutes and about 120 minutes, between about 1 minute and about 60 minutes, or between about 2 minutes and about 30 minutes. The time or duration of UV exposure is sufficient to observe desirable changes in stress. In some implementations, the temperature during UV exposure is between about 100° C. and about 700° C., between about 150° C. and about 550° C., or between about 200° C. and about 500° C. The temperature regime may be limited by thermal budget constraints, meaning that the substrate temperature during UV treatment is affected by device and film on the semiconductor substrate. For example, the use of nickel monosilicide (NiSi) layers constrains the substrate temperature to less than 400° C., and the use of nickel platinum silicide (NiPtSi) layers constrains the substrate temperature to less than 480° C. In some implementations, the intensity of UV exposure is between about 1 µW/cm$^2$ and about 10 W/cm$^2$, between about 10 µW/cm$^2$ and about 5 W/cm$^2$, or between about 50 µW/cm$^2$ and about 1 W/cm$^2$. The intensity of the UV radiation may provide sufficient energy to break certain bonds (e.g., Si—H and N—H bonds) in the UV-curable film.

Other conditions during UV curing may be controlled to affect UV treatment. In some implementations, selectively curing the UV-curable film may occur at pressures between about 1 Torr and about 760 Torr, between about 2 Torr and about 300 Torr, or between about 5 Torr and about 15 Torr. In some implementations, an inert or carrier gas such as helium (He), argon (Ar), or nitrogen ($N_2$) may be flowed during selective curing of the one or more first regions of the UV-curable film.

In some implementations, exposed regions of the UV-curable film may substantially modulate in stress values after selective curing of the UV-curable film, where the exposed regions may modulate by an amount greater than about 200 MPa, between about 200 MPa and about 4000 MPa, or between about 200 MPa and about 2000 MPa. By way of an example, the exposed regions of the UV-curable film may each have a stress value of about −100 MPa or less (more negative) prior to selective curing. The exposed regions of the UV-curable film may each have a stress value of about +100 MPa or more after selective curing. By way of an alternative example, the exposed regions of the UV-curable film may each have a stress value of about +100 MPa or more prior to selective curing. The exposed regions of the UV-curable film may each have a stress value of about −100 MPa or less (more negative) after selective curing. In these instances, this shows that the exposed regions of the UV-curable film can modulate by 200 MPa or more after selective curing. As discussed above, how much the exposed regions modulate in stress can depend on UV exposure conditions.

In some implementations, the process 200 may further include providing a second pre-patterned mask between the UV source and the bowed semiconductor substrate, and selectively curing one or more second regions of the UV-curable film using the second pre-patterned mask that selectively exposes the one or more second regions to UV radiation to locally modulate stress in the UV-curable film. In some implementations, the one or more second regions may be different than the one or more first regions of the UV-curable film. In some implementations, at least some of the one or more second regions may be the same as the one or more first regions of the UV-curable film. Application of the second pre-patterned mask allows varying degrees of localized stress modulation for different regions across the UV-curable film. Selectively curing the one or more second regions occurs under different conditions than selectively curing the one or more first regions. Time, temperature, intensity, and wavelength of UV exposure when selectively curing using the first pre-patterned mask than time, temperature, intensity, and wavelength of UV exposure when selectively curing using the second pre-patterned mask. Thus, stress modulation in the one or more second regions may be different than stress modulation in the one or more first regions of the UV-curable film.

Figure 3C:
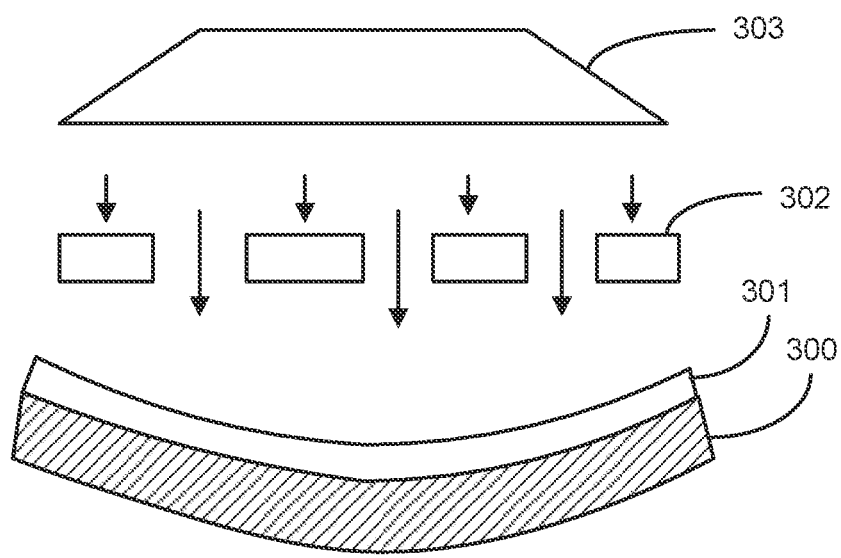

FIG. 3C shows a cross-sectional schematic illustration of the bowed semiconductor substrate of FIG. 3B being selectively exposed to UV radiation. A pre-patterned mask 302 is positioned between the UV-curable film 301 of the bowed semiconductor substrate 300 and a UV source 303. The UV source 303 is configured to emit UV radiation towards the bowed semiconductor substrate 300. The pre-patterned mask 302 selectively permits UV radiation to cure some regions of the UV-curable film 301 while selectively blocking UV radiation from other regions of the UV-curable film 301. The pre-patterned mask 302 has one or more openings. The one or more openings in the pre-patterned mask 302 facilitate localized stress modulation of the bowed semiconductor substrate 300.

UV treatment conditions may be fine-tuned to control an amount of localized stress modulation. UV treatment conditions such as time, temperature, intensity, and wavelength of UV exposure may be controlled to vary localized stress modulation. These knobs may serve to adjust how much stress is modulated in each of the exposed regions of the UV-curable film 301 compared to non-exposed regions of the UV-curable film 301. In some implementations, the time of UV exposure may be between about 0.5 minutes and about 120 minutes, between about 1 minute and about 60 minutes, or between about 2 minutes and about 30 minutes. In some implementations, substrate temperature during UV exposure may be between about 100° C. and about 700° C., between about 150° C. and about 550° C., or between about 200° C. and about 500° C. In some implementations, intensity of UV exposure may be between about 1 µW/cm$^2$ and about 10 W/cm$^2$, between about 10 µW/cm$^2$ and about 5 W/cm$^2$, or between about 50 µW/cm$^2$ and about 1 W/cm$^2$. In some implementations, wavelength of UV exposure may be between about 200 nm and about 800 nm.

Figure 3D:
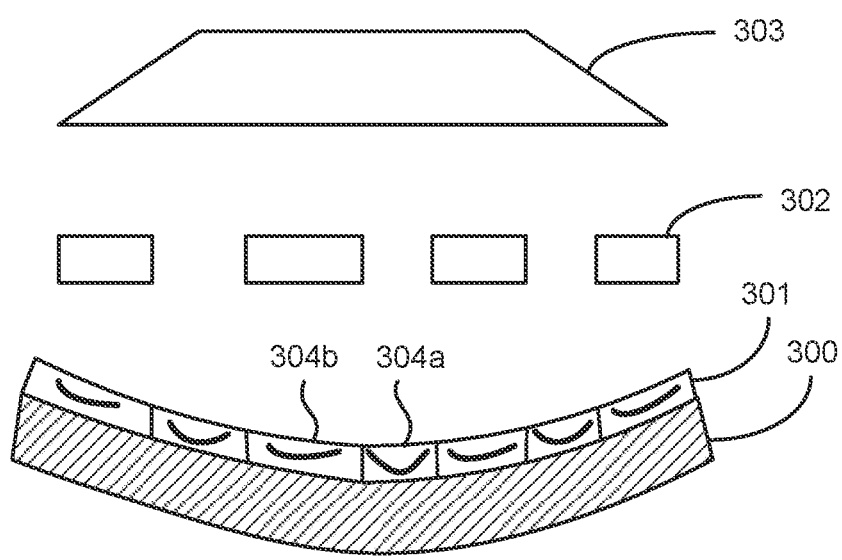

FIG. 3D shows a cross-sectional schematic illustration of the bowed semiconductor substrate of FIG. 3C after one or more exposed regions of the UV-curable film disposed on the bowed semiconductor substrate are selectively cured. The UV-curable film 301 includes exposed regions 304a that are selectively UV cured and non-exposed regions 304b that are selectively isolated from UV exposure. The difference in local stress between exposed regions 304a and non-exposed regions 304b may be substantial, where the difference in local stress may be at least a few hundred MPa (e.g., 200 MPa or greater). Changes in stress in non-exposed regions 304b are less than changes in stress in exposed regions 304a. As shown in FIG. 3D, the non-exposed regions 304b are less tensile and the exposed regions 304a are more tensile in stress after UV exposure. UV curing with the pre-patterned mask 302 provides selective and localized stress changes on the bowed semiconductor substrate 300.

Figure 2B:
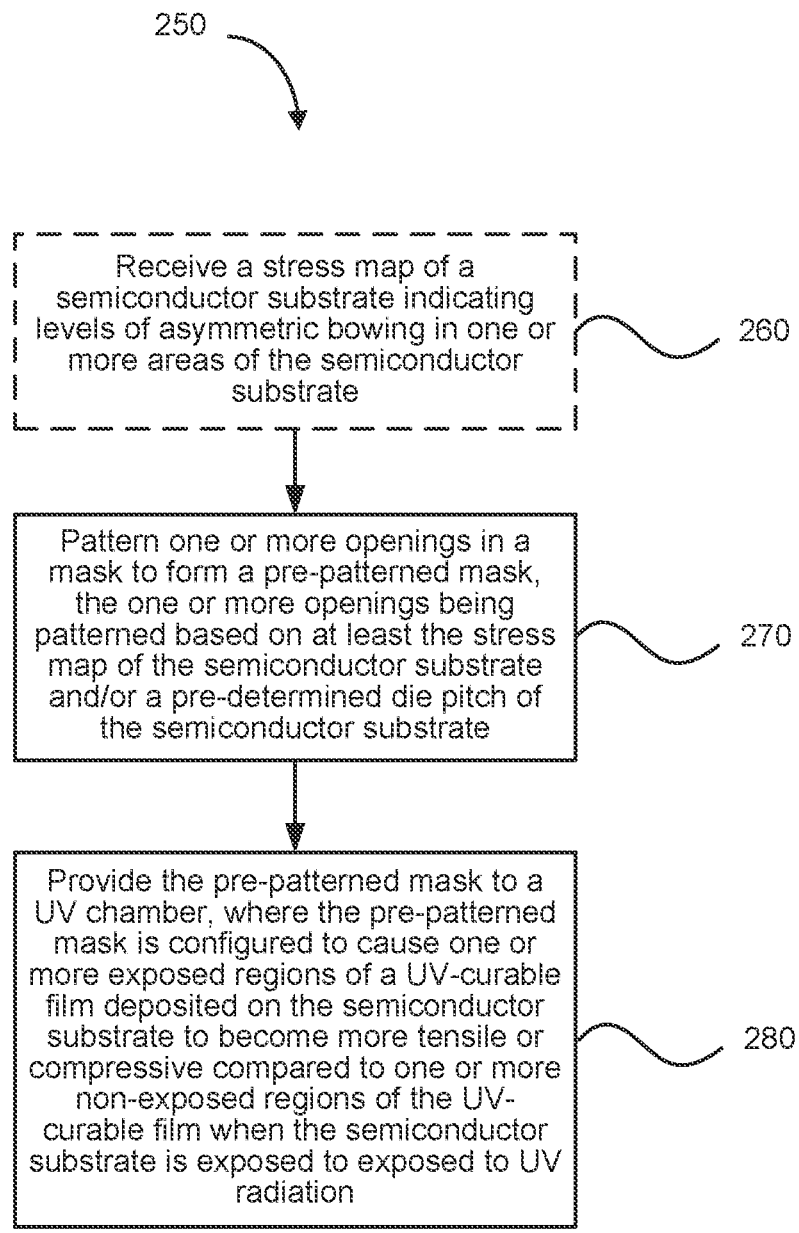
FIG. 2B illustrates a flow diagram of an example method of preparing a mask for localized stress modulation according to some implementations.

FIG. 2B illustrates a flow diagram of an example method of preparing a mask for localized stress modulation according to some implementations. The operations of a process 250 may be performed in different orders and/or with different, fewer, or additional operations. The operations of the process 250 may be performed using an apparatus for patterning a mask. In some implementations, the operations of the process 250 may be implemented, at least in part, according to software stored in one or more non-transitory computer readable media.

At block 260 of the process 250, a stress map is optionally received of a semiconductor substrate indicating levels of asymmetric bowing in one or more areas of the semiconductor substrate. In some implementations, the semiconductor substrate includes a patterned 3D-NAND structure and one or more etched trenches in the semiconductor substrate. The stress map may indicate levels of bowing in localized areas of the semiconductor substrate. The one or more areas of the semiconductor substrate reflect areas of high compressive or tensile stress. Areas of high compressive or tensile stress may be greater than about ±200 MPa.

At block 270 of the process 250, one or more openings are patterned in a mask to form a pre-patterned mask, where the one or more openings being patterned are based at least in part on the stress map of the semiconductor substrate and/or a die pitch of the semiconductor substrate. Different geometry masking techniques may be used to fabricate the one or more openings in the mask to form the pre-patterned mask. In some implementations, the areas of high compressive or tensile stress are identified. In some implementations, the one or more openings correspond to the areas of high compressive or tensile stress. In addition or in the alternative, the die pitch of the semiconductor substrate is determined. In some implementations, the one or more openings are spaced apart based on the pre-determined die pitch. The pre-patterned mask may be made of a material that is configured to block or substantially block UV radiation.

Figure 4:
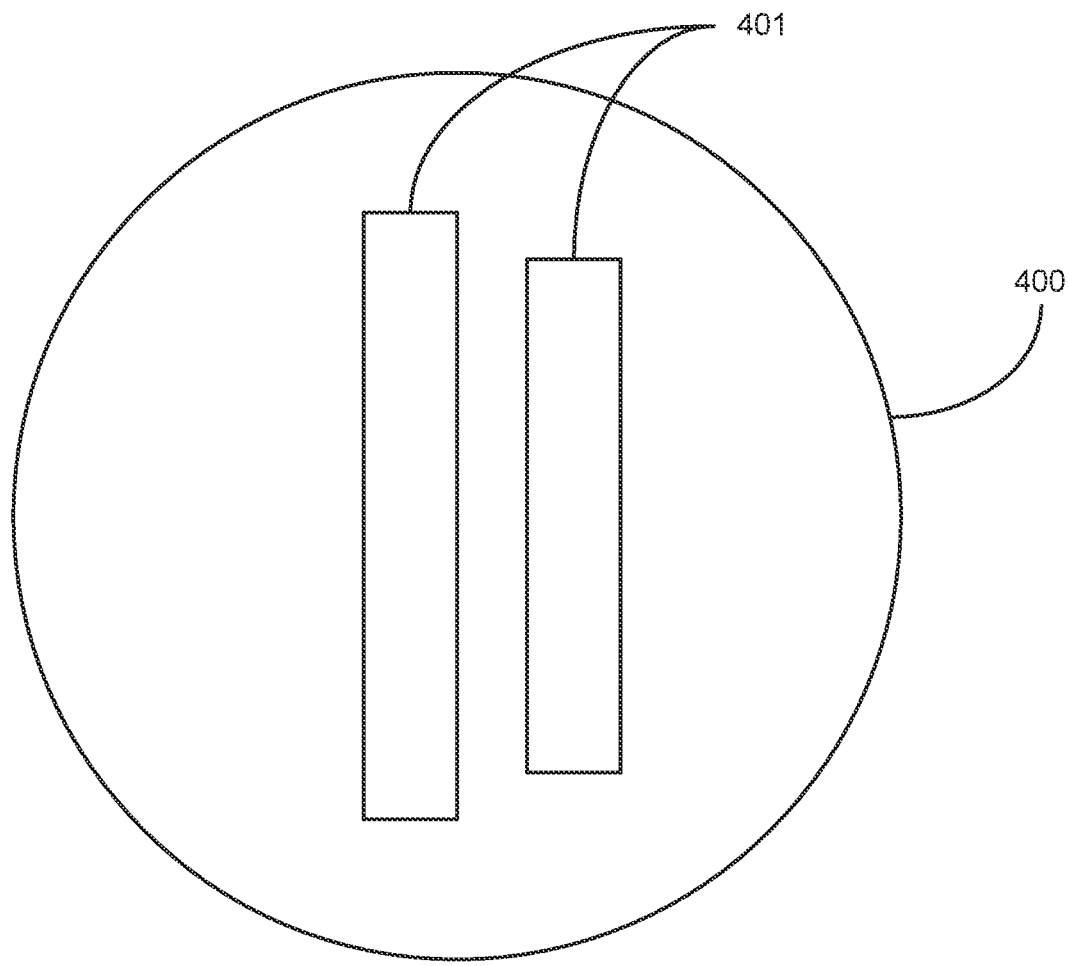
FIG. 4 shows a schematic diagram of an example pre-patterned mask for selectively exposing regions of a UV-curable film for localized stress modulation according to some implementations.

FIG. 4 shows a schematic diagram of an example pre-patterned mask for selectively exposing regions of a UV-curable film for localized stress modulation according to some implementations. The pre-patterned mask 400 is configured to overlay a semiconductor substrate (not shown). Openings 401 in the pre-patterned mask permit UV radiation to pass through. The openings 401 are positioned, sized, and shaped to address areas of localized bowing/stress in the semiconductor substrate. In some cases, areas of localized bowing/stress may be a result of metal lines in a 3D-NAND structure that run longitudinally along a single axial direction (e.g., y-axis direction). However, the 3D-NAND structure may lack metal lines running in a perpendicular direction (e.g., x-axis direction). Thus, the openings 401 may be patterned to correspond to the configuration of metal lines in the 3D-NAND structure on the semiconductor substrate.

Returning to FIG. 2, at block 280 of the process 250, the pre-patterned mask is provided in a UV chamber, where the pre-patterned mask is configured to cause one or more exposed regions of a UV-curable film deposited on the semiconductor substrate to become more tensile or more compressive compared to one or more non-exposed regions of the UV-curable film when the semiconductor substrate is exposed to UV radiation. The pre-patterned mask is provided between a UV source configured to emit the UV radiation and the semiconductor substrate. The UV-curable film may be deposited on a front side or backside of the semiconductor substrate. In some implementations, the UV-curable film includes an ultralow-k dielectric material or a nitride such as silicon nitride. Regions underneath the pre-patterned mask are blocked from UV curing to define the non-exposed regions, and regions underneath the one or more openings are exposed to UV curing to define the exposed regions. The exposed regions undergo more changes in stress than the non-exposed regions so that localized stress can be modulated in the semiconductor substrate.

Apparatus

Disclosed embodiments may be performed in any suitable apparatus or tool. An apparatus or tool may include one or more process stations. Described below are example process stations and tools that may be used in some embodiments.

FIG. 5 illustrates a schematic diagram of an example apparatus for deposition of a UV-curable film according to some implementations. In some implementations, process station 500 is configured for PECVD processes. The process station 500 includes a process chamber body 502 capable of maintaining a low pressure environment. In some embodiments, one or more hardware parameters of PECVD process station 500, including those discussed in detail below, may be adjusted programmatically by one or more computer controllers 550.

PECVD process station 500 fluidly communicates with reactant delivery system 501a for delivering process gases to a distribution showerhead 506. Reactant delivery system 501a includes a mixing vessel 504 for blending and/or conditioning process gases for delivery to showerhead 506. Process gases such as those used to deposit a UV-curable film on a substrate may be delivered to the process chamber body 502 via showerhead 506 using the reactant delivery system 501a. In some embodiments, reactive species may be delivered using the reactant delivery system 501a. One or more mixing vessel inlet valves 520 may control introduction of process gases to mixing vessel 504. These valves may be controlled depending on whether a gas may be turned on during various operations.

Note that in some embodiments, a liquid reactant may not be used. However in some embodiments, a liquid reactant may be used to form a tensile or compressive film as described herein. As an example, the embodiment of FIG. 5 includes a vaporization point 503 for vaporizing liquid reactant to be supplied to the mixing vessel 504. In some embodiments, vaporization point 503 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant before or after vaporizing a reactant. However, purging the delivery piping may increase process station cycle time, degrading process station throughput. Thus, in some embodiments, delivery piping downstream of vaporization point 503 may be heat traced. In some examples, mixing vessel 504 may also be heat traced. In one non-limiting example, piping downstream of vaporization point 503 has an increasing temperature profile extending from approximately 100° C. to approximately 150° C. at mixing vessel 504.

In some embodiments, liquid precursor or liquid reactant, such as a silicon-containing precursor, may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to showerhead 506.

In some embodiments, a liquid flow controller (LFC) (not shown) upstream of vaporization point 503 may be provided for controlling a mass flow of liquid for vaporization and delivery to process station 500. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for flowing a liquid reactant. Thus, in some embodiments, the LFC may be dynamically switched between a feedback control mode and a direct control mode. In some embodiments, this may be performed by disabling a sense tube of the LFC and the PID controller.

Showerhead 506 distributes gases toward substrate 512. For example, showerhead 506 may distribute process gases for depositing a UV-curable film to the backside or front side of the substrate 512 in various operations, such as silicon-containing gases and/or oxygen-containing or nitrogen-containing gases. In the embodiment shown in FIG. 5, the substrate 512 is located beneath showerhead 506 and is shown resting on a pedestal 508. In some embodiments, the pedestal 508 may include wafer holders to hold a wafer by the edges and a bottom showerhead (not shown) for delivering gases to the backside of a wafer. Showerhead 506 may have any suitable shape, and may have any suitable number and arrangement of ports for distributing process gases to substrate 512. A shield (not shown) may also be present in the chamber body 502.

In another scenario, adjusting a height of pedestal 508 may allow a plasma density to be varied during disclosed processes such that the plasma density between the wafer and the bottom showerhead is varied. For example, the plasma may be activated when process gases are flowed to the chamber body 502. At the conclusion of the process, pedestal 508 may be lowered during another substrate transfer phase to allow removal of substrate 512 from pedestal 508.

In some embodiments, showerhead 506 and pedestal 508 electrically communicate with a radio frequency (RF) power supply 514 and matching network 516 for powering a plasma. In some embodiments, the plasma energy may be controlled by controlling one or more of a process station pressure, gas concentrations and partial pressures of gases or gas flow rates, an RF source power, and an RF source frequency. For example, RF power supply 514 and matching network 516 may be operated at any suitable power to form a plasma having a desired composition of radical species. Likewise, RF power supply 514 may provide RF power of any suitable frequency. In some embodiments, RF power supply 514 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for a reaction for depositing a bow compensation layer.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics.

Such monitors may include, but are not limited to, infrared (IR) monitors, acoustic monitors, and pressure transducers.

In some embodiments, instructions for a controller 550 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of one or more gases (e.g., a silicon-containing gas and a nitrogen-containing gas), and time delay instructions for the first recipe phase. A second, subsequent recipe phase may include instructions for setting a flow rate of a purge gas and time delay instructions for the second recipe phase. Alternatively, a third recipe phase may include instructions for setting a flow rate of one or more gases (e.g., a silicon-containing gas and an oxygen-containing gas), and time delay instructions for the third recipe phase. It will be appreciated that these recipe phases may be further subdivided and/or iterated in any suitable way within the scope of the present disclosure. Controller 550 may also include any of the features described below with respect to controller 750 in FIG. 7.

In some embodiments, pedestal 508 may be temperature controlled via heater 510. Heater 510 may be used to heat the substrate. For example, in some embodiments, during heating, the heater 510 may be set to a temperature between about 200° C. and about 500° C. Further, in some embodiments, pressure control for process station 500 may be provided by butterfly valve 518. As shown in the embodiment of FIG. 5, butterfly valve 518 throttles a vacuum provided by a downstream vacuum pump (not shown). However, in some embodiments, pressure control of process station 500 may also be adjusted by varying a flow rate of one or more gases introduced to the process station 500.

Figure 6:
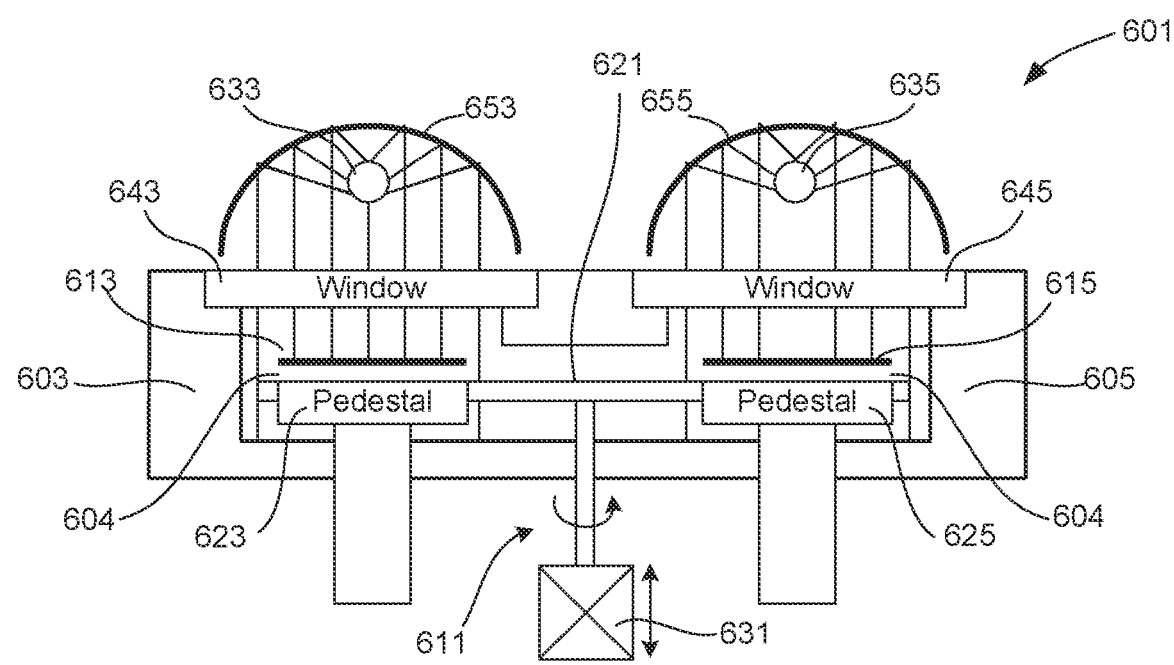
FIG. 6 illustrates a schematic diagram of an example apparatus for UV curing of a UV-curable film according to some implementations.

FIG. 6 illustrates a schematic diagram of an example apparatus for UV curing of a UV-curable film according to some implementations. The apparatus 601 is appropriate for uses that involve broadband UV sources. The apparatus 601 includes multiple cure stations 603 and 705, each of which accommodates a substrate 613 and 615. The substrates 613 and 615 are located above pedestals 623 and 625. There are gaps 604 between the substrates and the pedestals. The substrate may be supported above the pedestal by an attachment, such as a pin, or floated on gas. Parabolic or planar cold mirrors 653 and 655 are located above broadband UV source sets 633 and 635. UV light from lamp sets 633 and 635 passes through windows 643 and 645. Substrates 613 and 615 are then exposed to UV radiation. In alternative embodiments, the substrate may be supported by the pedestals 623 and 625. In such embodiments, the lamps may or may not be equipped with cold mirrors. By making full contact with the pedestal, the substrate temperature may be maintained by use of a conductive gas such as helium or a mixture of helium and argon at a sufficient pressure for conductive heat transfer, typically between about 20 and about 760 Torr, or between about 100 and about 600 Torr.

In operation, a substrate enters the chamber at station 603 where a first UV cure operation is performed. A first pre-patterned mask (not shown) may be provided between the substrate 613 and the window 643. Pedestal temperature at station 603 is set to a first temperature, e.g. between about 200° C. and about 500° C., with the UV lamps above station 603 set to a first intensity, e.g., 100% maximum intensity, and first wavelength range, e.g., about 200-800 nm. In some implementations, after curing in station 603 for a sufficient time, the substrate may be transferred to station 605 for further curing. A second pre-patterned mask (not shown) may be provided between the substrate 615 and the window 645. Pedestal temperature at station 605 is set to a second temperature, which may or may not be the same as the first station and UV intensity is set to a second intensity, e.g. 90% intensity. Additional stations may be used for additional UV curing under different conditions.

In order to irradiate the substrate at different wavelengths or wavelengths ranges while using a broadband UV source, which generates radiation in a broad spectrum, optical components may be used in the radiation source to modulate the part of the broad spectrum that reaches the substrate. For example, reflectors, filters, or combination of both reflectors and filters may be used to subtract a part of the spectrum from the radiation. On reaching the filter, light may be reflected, absorbed into the filter material, or transmitted through.

Long pass filters are interference filters, which provide a sharp cut-off below a particular wavelength. They are useful for isolating specific regions of the spectrum. Long pass filters are used to pass, or transmit, a range of wavelengths and to block, or reflect, other wavelengths on the shorter wavelength side of the passband. Long wavelength radiation is transmitted, while short wavelength radiation is reflected. The region of high transmittance is known as the passband and the region of high reflectance is known as the reject or reflectance band. The roll-off region separates the pass-band and reflect-band. The complexity of long pass filters depends primarily upon the steepness of the transition region and also on the ripple specifications in the passband. In the case of a relatively high angle of incidence, polarization dependent loss may occur. Long pass filters are constructed of hard, durable surface materials covered dielectric coatings. They are designed to withstand normal cleaning and handling.

Another type of filter is UV cut-off filter. These filters do not allow UV transmission below a set value, e.g. 280 nm. These filters work by absorbing wavelengths below the cut-off value. This may be helpful to optimize the desired cure effect.

Yet another optical filter that may be used to select a wavelength range is a bandpass filter. Optical bandpass filters are designed to transmit a specific waveband. They are composed of many thin layers of dielectric materials, which have differing refractive indices to produce constructive and destructive interference in the transmitted light. In this way optical bandpass filters can be designed to transmit a specific waveband only. The range limitations are usually dependent upon the interference filters lens, and the composition of the thin-film filter material. Incident light is passed through two coated reflecting surfaces. The distance between the reflective coatings determines which wavelengths will destructively interfere and which wavelengths will be allowed to pass through the coated surfaces. In situations where the reflected beams are in phase, the light will pass through the two reflective surfaces. However, if the wavelengths are out of phase, destructive interference will block most of the reflections, allowing almost nothing to transmit through. In this way, interference filters are able to attenuate the intensity of transmitted light at wavelengths that are higher or lower than the desired range.

Another filter that can attenuate the wavelengths of the radiation reaching the substrate is the window 643, typically made of quartz. By changing the level of metal impurities and water content, the quartz window can be made to block radiations of undesired wavelengths. High-purity silica quartz with very little metal impurity is more transparent deeper into the ultraviolet. As an example, quartz with a thickness of 1cm will have a transmittance of about 50% at a wavelength of 170 nm, which drops to only a few percent at 160 nm. Increasing levels of impurities in the quartz cause transmission of UV at lower wavelengths to be reduced. Electrically fused quartz has a greater presence of metallic impurities, limiting its UV transmittance wavelength to around 200 nm and longer. Synthetic silica, on the other hand, has much greater purity and will transfer down to 170 nm. For infrared radiation, the transmittance through quartz is determined by the water content. More water in the quartz means that infrared radiation is more likely absorbed. The water content in the quartz may be controlled through the manufacturing process. Thus, the spectrum of radiation transmission through the quartz window may be controlled to cutoff or reduce UV transmission at shorter wavelengths and/or to reduce infrared transmission at longer wavelengths.

In addition to changing the wavelengths by altering the radiation that reaches the substrate, radiation wavelength can also be controlled by modifying the properties of the light generator. Broadband UV source can generate a broad spectrum of radiation, from UV to infrared, but other light generators may be used to emit a smaller spectrum or to increase the intensity of a narrower spectrum. Other light generators may be mercury-vapor lamps, doped mercury-vapor lamps, electrode lamps, excimer lamps, excimer lasers, pulsed Xenon lamps, doped Xenon lamps. Lasers such as excimer lasers can emit radiation of a single wavelength. When dopants are added to mercury-vapor and to xenon lamps, radiation in a narrow wavelength band may be made more intense. Common dopants are iron, nickel, cobalt, tin, zinc, indium, gallium, thallium, antimony, bismuth, or combinations of these. For example, mercury vapor lamps doped with indium emits strongly in the visible spectrum and around 450 nm; iron, at 360 nm; and gallium, at 320 nm. Radiation wavelengths can also be controlled by changing the fill pressure of the lamps. For example, high-pressure mercury vapor lamps can be made to emit wavelengths of 250 nm to 440 nm, particularly 310 nm to 350 nm more intensely. Low-pressure mercury vapor lamps emit at shorter wavelengths.

In addition to changing light generator properties and the use of filters, reflectors that preferentially deliver one or more segments of the lamps spectral output may be used. A common reflector is a cold mirror that allows infrared radiation to pass but reflects other light. Other reflectors that preferentially reflect light of a spectral band may be used. Therefore a substrate may be exposed to radiation of different wavelengths at different stations. Of course, the radiation wavelengths may be the same in some stations.

In FIG. 6, pedestals 623 and 625 are stationary. Indexer 611 lifts and moves each substrate from one pedestal to another between each exposure period. Indexer 611 includes an indexer plate 621 attached to a motion mechanism 631 that has rotational and axial motion. Upward axial motion is imparted to indexer plate 621 to pick up substrates from each pedestal. The rotational motion serves to advance the substrates from one station to another. The motion mechanism then imparts downward axial motion to the plate to put the substrates down on the stations.

Pedestals 623 and 625 are electrically heated and maintained at a desired process temperature. Pedestals 623 and 625 may also be equipped with cooling lines to enable precise substrate temperature control. In an alternate embodiment, a large heater block may be used to support the substrates instead of individual pedestals. A thermally conductive gas, such as helium, is used to effect good thermal coupling between the pedestal and the substrate. In some embodiments, cast pedestals with coaxial heat exchangers may be used.

FIG. 6 shows only an example of a suitable apparatus, and other apparatuses designed for other methods involved in previous and/or subsequent processes may be used. For example, in another embodiment that uses broadband UV source, the substrate support is a carousel. Unlike with the stationary pedestal substrate supports, the substrates do not move relative to the carousel. After a substrate is loaded onto the carousel, the carousel rotates, if necessary, to expose the substrate to light from a UV lamp set. The carousel is stationary during the exposure period. After the exposure period, the carousel rotates to advance each substrate for exposure to the next set of lamps. Heating and cooling elements may be embedded within the rotating carousel. Alternatively the carousel may be in contact with a heater plate or hold the substrates so that they are suspended above a heater plate.

In certain embodiments, the substrates are exposed to UV radiation from focused, rather than, flood lamps. Unlike the broadband source embodiments wherein the substrates are stationary during exposure (as in FIG. 6), there is relative movement between the substrates and the light sources during exposure to the focused lights as the substrates are scanned. In other embodiments, the substrates may be rotated relative to the light sources to average out any differences in intensity across the substrate.

Figure 7:
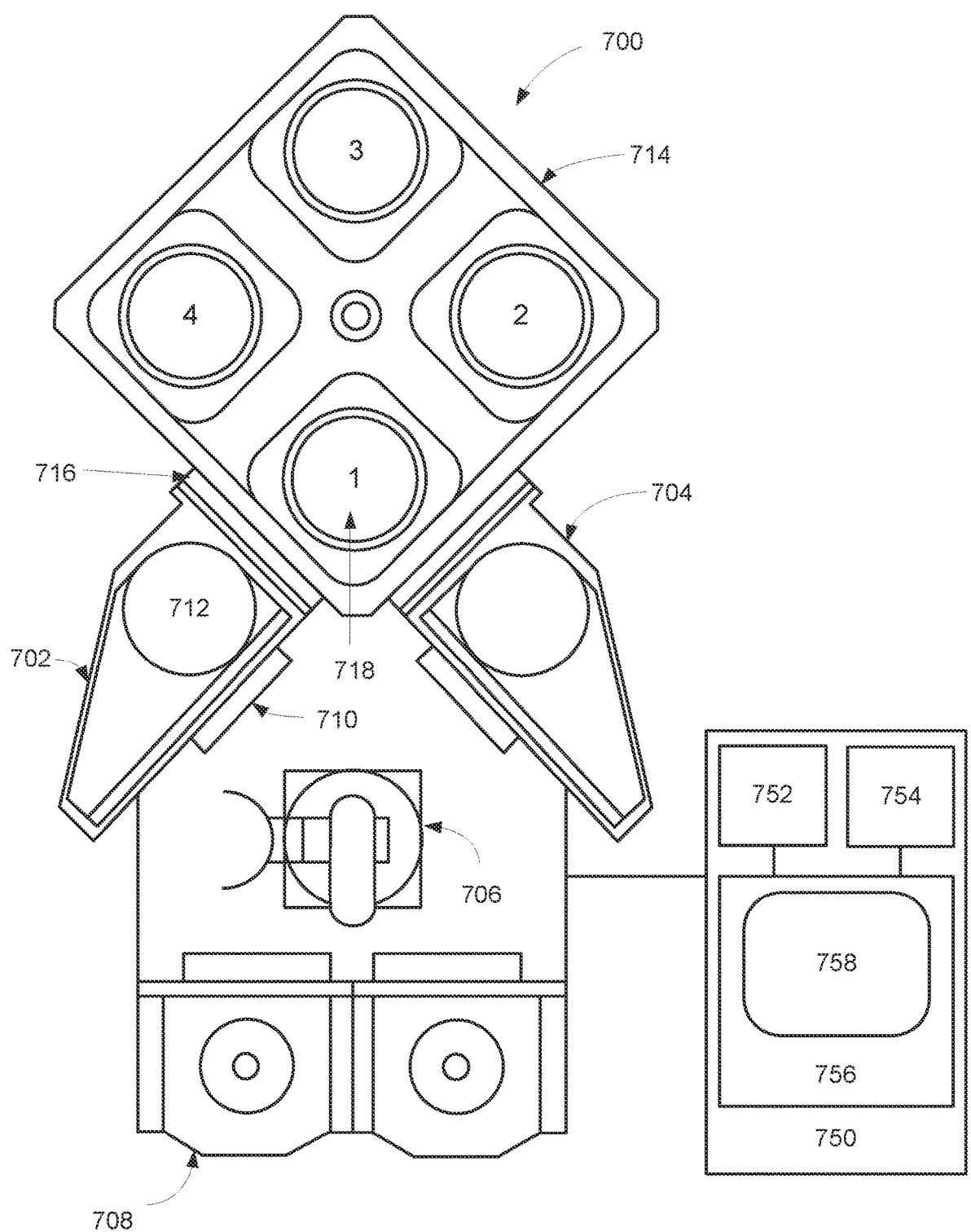
FIG. 7 illustrates a schematic diagram of an example process tool for performing operations for localized stress modulation according to some implementations.

FIG. 7 illustrates a schematic diagram of an example process tool for performing operations for localized stress modulation according to some implementations. The multi-station processing tool 700 can include an inbound load lock 702 and an outbound load lock 704, either or both of which may comprise a plasma source and/or UV source. A robot 706, at atmospheric pressure, is configured to move wafers from a cassette loaded through a pod 708 into inbound load lock 702 via an atmospheric port 710. A wafer (not shown) is placed by the robot 706 on a pedestal 712 in the inbound load lock 702, the atmospheric port 710 is closed, and the load lock inbound 702 is pumped down. Where the inbound load lock 702 includes a remote plasma source, the wafer may be exposed to a remote plasma treatment in the inbound load lock 702 prior to being introduced into a processing chamber 714. Further, the wafer also may be heated in the inbound load lock 702 as well, for example, to remove moisture and adsorbed gases. Next, a chamber transport port 716 to processing chamber 714 is opened, and another robot (not shown) places the wafer into the reactor on a pedestal of a first station shown in the reactor for processing. While the embodiment depicted in FIG. 7 includes load locks, it will be appreciated that, in some embodiments, direct entry of a wafer into a process station may be provided.

The depicted processing chamber 714 includes four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. For example, in some embodiments, a process station may be switchable between a CVD and PECVD process mode. In another example, deposition operations may be performed in one station, while exposure to UV radiation for UV curing may be performed in another station. In some embodiments, deposition and UV curing are performed in the same station.

While the depicted processing chamber 714 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 depicts an embodiment of a wafer handling system 790 for transferring wafers within processing chamber 714. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog, and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 700. System control software 758 may be configured in any suitable way. For example, various process tool component subroutines or control objects may be written to control operation of the process tool components used to carry out various process tool processes. System control software 758 may be coded in any suitable computer readable programming language.

In some embodiments, system control software 758 may include input/output control (IOC) sequencing instructions for controlling the various parameters described above. Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700.

A process gas control program may include code for controlling gas composition (e.g., silicon-containing gases, oxygen-containing gases, gases for performing a post-dose treatment, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 750 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 750 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 750.

In some implementations, the system controller 750 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 750, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 750 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 750, in some implementations, may be a part of or coupled to a computer that is integrated with, coupled to the system, otherwise networked to the system, or a combination thereof. For example, the system controller 750 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 750 receives instructions in the form of data, which specify parameters for each of the processing steps to be performed during one or more operations. It should be understood that the parameters may be specific to the type of process to be performed and the type of tool that the system controller 750 is configured to interface with or control. Thus as described above, the system controller 750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

OTHER EMBODIMENTS

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of modulating local stress on a substrate, the method comprising:
   providing a bowed semiconductor substrate;
   depositing a UV-curable film on the bowed semiconductor substrate; and
   selectively curing one or more first regions of the UV-curable film by exposing the one or more first regions to ultraviolet (UV) radiation and using a first pre-patterned mask so as to locally modulate stress on the UV-curable film, wherein the UV-curable film mitigates bowing of the bowed semiconductor substrate.

2. The method of claim 1, further comprising:
   providing the first pre-patterned mask between a UV source and the semiconductor substrate, wherein the first pre-patterned mask includes one or more openings corresponding to the one or more first regions of the UV-curable film.

3. The method of claim 2, further comprising:
   measuring warpage across the bowed semiconductor substrate to determine localized stresses on the bowed semiconductor substrate; and
   patterning the one or more openings in a mask to form the first pre-patterned mask, the one or more openings being patterned based on at least the localized stresses on the bowed semiconductor substrate.

4. The method of claim 1, wherein the one or more first regions of the UV-curable film is exposed to the UV radiation according to a controlled time, temperature, intensity, and/or wavelength of UV radiation for locally modulating the stress in the one or more first regions of the UV-curable film.

5. The method of claim 4, wherein a temperature of exposure to UV radiation is between about 200° C. and about 500° C.

6. The method of claim 4, wherein a time of exposure to UV radiation is between about 1 minute and about 60 minutes.

7. The method of claim 4, wherein an intensity of the UV radiation is between about 1 $\mu W/cm^2$ and about 10 $W/cm^2$.

8. The method of claim 1, wherein the UV-curable film includes silicon nitride.

9. The method of claim 1, wherein the UV radiation is configured to locally modulate stress on the UV-curable film by an amount between about 200 MPa and about 4000 MPa.

10. The method of claim 9, wherein an as-deposited stress of the UV-curable film in the one or more first regions is less than about-100 MPa, and wherein a post-cured stress of the UV-curable film in the one or more first regions is greater than about 100 MPa.

11. The method of 1, wherein the UV-curable film has a thickness between about 25 nm and about 100 nm.

12. The method of claim 1, wherein the bowed semiconductor substrate is asymmetrically bowed having a warpage greater than about ±300 µm.

13. The method of claim 1, wherein depositing the UV-curable film on the bowed semiconductor substrate occurs on a backside of the bowed semiconductor substrate.

14. The method of claim 1, wherein selectively curing the one or more first regions of the UV-curable film by using the first pre-patterned mask causes one or more exposed regions of the UV-curable film to become more tensile in stress compared to one or more non-exposed regions of the UV-curable film.

15. The method of claim 1, further comprising:
selectively curing one or more second regions of the UV-curable film by using a second pre-patterned mask that selectively exposes the one or more second regions to UV radiation, wherein the selectively curing the one or more second regions occurs under different conditions than selectively curing the one or more first regions.

16. A method of preparing a mask for localized stress modulation, the method comprising:
patterning one or more openings in a mask to form a pre-patterned mask, the one or more openings being patterned based on at least a stress map of a semiconductor substrate and/or pre-determined die pitch of the semiconductor substrate; and
providing the pre-patterned mask to an ultraviolet (UV) chamber, wherein the pre-patterned mask is configured to cause one or more exposed regions of a UV-curable film deposited on the semiconductor substrate to become more tensile compared to one or more non-exposed regions of the UV-curable film when the semiconductor substrate is exposed to UV radiation.

17. The method of claim 16, further comprising:
receiving a stress map of a semiconductor substrate indicating levels of asymmetric bowing in one or more areas of the semiconductor substrate.

18. An apparatus for modulating stress on a substrate, the apparatus comprising:
a processing chamber comprising:
a substrate support for supporting a bowed semiconductor substrate, and an ultraviolet (UV) source for exposing the bowed semiconductor substrate to UV radiation; and
a controller configured with instructions for performing the following operations:
provide the bowed semiconductor substrate in the processing chamber having a UV-curable film deposited on a front side or backside of the bowed semiconductor substrate; and
selectively cure one or more first regions of the UV-curable film by using a first pre-patterned mask that selectively exposes the one or more first regions to ultraviolet (UV) radiation so as to locally modulate stress on the UV-curable film, wherein the UV-curable film mitigates bowing of the bowed semiconductor substrate.

19. The apparatus of claim 18, wherein the controller is configured with instructions for varying time, temperature, intensity, and/or wavelength of UV radiation when selectively curing the one or more first regions of the UV-curable film.

20. The apparatus of claim 18, further comprising:
a deposition chamber separate from the processing chamber; wherein the controller is further configured with instructions for performing the following operation:
deposit the UV-curable film on the front side or backside of the bowed semiconductor substrate.

* * * * *